April 23, 1957 C. W. RHODE 2,790,118

THREE-ELEMENT SEMICONDUCTOR DEVICE

Filed Aug. 25, 1953

CLYDE W. RHODE,
INVENTOR.

BY [signature]
ATTORNEY

United States Patent Office 2,790,118

Patented Apr. 23, 1957

2,790,118

THREE-ELEMENT SEMICONDUCTOR DEVICE

Clyde W. Rhode, Van Nuys, Calif., assignor, by mesne assignments, to National Aircraft Corporation, Burbank, Calif., a corporation of California Application August 25, 1953, Serial No. 376,321

12 Claims. (Cl. 317—235)

This invention relates to a three-element semiconductor device, and particularly to a transistor device constructed to facilitate the proper adjustment of the emitter and collector relative to each other and to the semiconductor element. More specifically, the invention pertains to a novel construction for a transistor of the type described and claimed in co-pending application Serial No. 353,999, filed May 11, 1953, by Lowell S. Pelfrey, now abandoned, for a Three-Element Semiconductor Device, and assigned to the assignee of the present invention.

In conventional three-element semiconductor devices, commonly referred to as transistors, the germanium or other semiconductor is formed with two opposed surfaces one of which is in large area ohmic contact with the base and the other of which is adapted to be engaged by the pointed ends of the emitter and collector electrodes. With such a construction, the flow of current is through the main body of the semiconductor and the voltage gradients between the emitter, collector and semiconductor are such that the efficiency of the device is impaired. In addition, the relative locations of the base, collector and emitter of conventional transistors are such that the point-contacts, and particularly the point-contact between the collector and semiconductor, are relatively far from the base which is an excellent thermal conductor. It follows that the heat generated at the point-contacts is not conducted away but instead tends to build up and impair the operation of the device.

As distinguished from conventional transistors, the device described in the co-pending application referred to above embodies a semiconductor having two intersecting faces at substantially right angles to each other, one of the faces being in large area contact with the base and the other of the faces being engaged by the collector at a point closely adjacent the junction of the semiconductor and base. In addition, the point-contact between the emitter and semiconductor is located at a point relatively remote from the base-semiconductor junction and passing through the collector-semiconductor point-contact. In the operation of the described device, the flow of current is close to or along the surface of the semiconductor instead of through it, and the voltage gradients combine to effect an efficient transmission of holes between the emitter and collector. Furthermore, the described construction is highly effective in dissipating the heat generated at the collector-semiconductor point-contact since the closely adjacent base element operates as an effective heat conductor and dissipator. This is particularly important since the collector-semiconductor point-contact is, when the transistor is biased with conventional voltages, the largest source of the heat generated in the device.

In manufacturing the transistor described in the co-pending application, it is highly important that the spacing between the collector and base, as well as between the emitter and collector, be highly uniform between various transistors and be set accurately in accordance with predetermined design considerations. These spacings, and in addition the desired alignment of the point-contacts and the proper pressure between the semiconductor and the emitter and collector electrodes, are critical and are extremely difficult to achieve due to the extremely small size of the device. The present invention is directed to a novel arrangement of the base, semiconductor, emitter and collector elements, and to a novel construction of these elements, the construction and arrangement being such that accurate settings may be readily achieved by the assembler while the device is under direct microscopic observation.

In view of the above factors characteristic of the field of transistors, and particularly transistors of the type described in the co-pending application referred to above, it is an object of the present invention to provide a base-semiconductor sub-assembly constructed and adapted to be moved into predetermined engagement with pre-set emitter and collector electrodes to provide the necessary point-contact locations and the necessary contact pressures with great accuracy and with a minimum of difficulty.

A further object of the invention is to provide a transistor adapted to be assembled while under direct microscopic observation to insure the proper location of the point-contacts relative to each other and to the base.

An additional object is to provide a base electrode adapted to be manually slid into predetermined pressure-engagement with the collector and emitter electrodes and to remain in such engagement, without being held by the assembler, until it is permanently locked to its support.

These and other objects and advantages of the invention will be more fully set forth in the following specification and claims considered in connection with the attached drawing to which they relate.

Figures 1, 3:
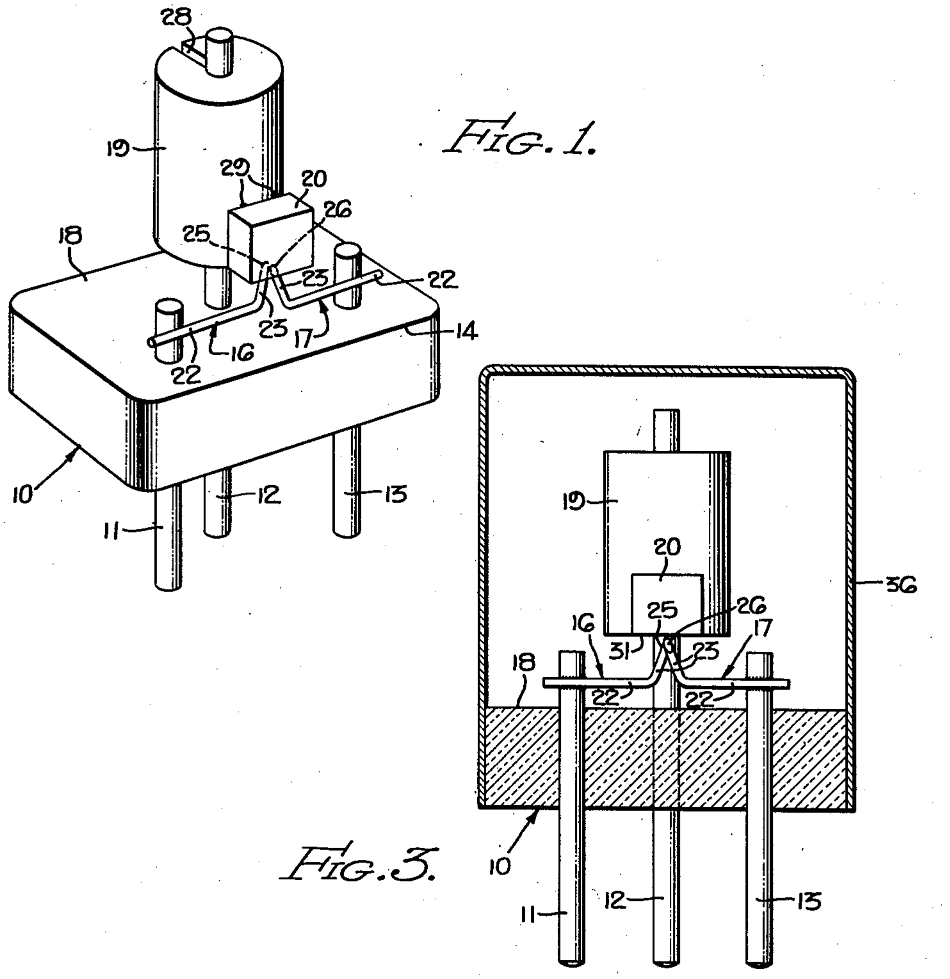
Figure 1 is a great enlarged perspective view of the device prior to the mounting of the housing thereon.
Figure 3 is a vertical sectional view taken along line 3—3 of Figure 2 but illustrating the device as assembled with its housing.

Referring to the drawing, the three-element semiconductor device may be seen to comprise an insulating support block 10, which is illustrated as rectangular in shape and is preferably formed of a suitable glass material, and three electrically conductive posts 11, 12 and 13 extending parallel to each other and completely through the support block. Two of the posts, numbered 11 and 13, correspond to each other and lie in a common vertical plane which is spaced somewhat rearwardly of the forward edge 14 of support block 10, while the third post, numbered 12, is illustrated as spaced generally midway between posts 11 and 13 but somewhat to the rear of their common plane. The corresponding posts 11 and 13 extend only a relatively small distance above support block 10 and serve as support posts for collector and emitter electrodes 16 and 17 which are respectively secured to them as by welding.

According to the invention, the post 12 serves as a slide post and extends for a considerable distance above the upper surface 18 of support block 10. Slidably mounted on post 12 is a base 19 having a suitable semiconductor 20 secured on its lower portion and in overhanging relation relative to the support block. Base 19 and the associated semiconductor 20 are adapted to be moved vertically on post 12 to force the semiconductor into predetermined point-contact with the collector and emitter electrodes 16 and 17, the latter being pre-set relative to support block 10 and post 12 since they are secured to posts 11 and 13 anchored in the support block, The construction is thus one in which a movable assembly, comprising base and semiconductor components 19 and 20, may be shifted relative to a stationary assembly comprising collector and emitter electrodes 16 and 17, posts 11, 12 and 13, and support block 10.

In the more specific construction of the transistor device, the collector 16 and emitter 17 each consist of a small diameter wire having a horizontal portion 22 and an integral upwardly extending portion 23. The upwardly extending portions 23 of the collector and emitter are in spaced overlapping relation, the arrangement being such that the pointed upper end 25 of collector 16 lies between the corresponding end 26 of emitter 17 and base 19. In a preferred form of the invention, the collector and emitter points 25 and 26 are disposed in line with slide post 12 and are spaced from each other a distance governed by the considerations more fully set forth in the co-pending application cited heretofore. Points 25 and 26 are positioned to be engaged, in point-contact relationship, by semiconductor 20 upon downward shifting of base 19.

In order to facilitate the achievement of the proper contact pressures between semiconductor 20 and electrode points 25 and 26, the base 19 is formed as an upright cylinder which is axially bored to receive slide post 12, the latter being preferably cylindrical in shape and formed of a suitable metal. The axial bore for post 12 communicates with a radial slot 28 which extends to the outer diameter of cylinder 19 for the purpose of imparting to it a certain amount of resilience. The diameter of the bore for post 12 is slightly less than the diameter of the post itself, so that the cylinder portion opposite slot 28 will be somewhat tensioned to provide for the resilient gripping engagement of the cylinder with the post. The relative diameters are selected so that the cylinder 19 will remain in position despite any upward pressure created when the semiconductor is pressed downwardly against electrodes 16 and 17, yet may be readily slid along the post 12 during the adjustment operation. The resilient engagement between cylinder 19 and post 12 not only permits the axial shifting of the cylinder along the post but results in an execllent electrical contact which presents little or no resistance to the passage of current. The cylinder 19 may be formed of brass, copper or any material having the desired characteristics of high electrical and thermal conductivity and sufficient resilience to permit its mounting on post 12 in the manner indicated.

Figure 2:
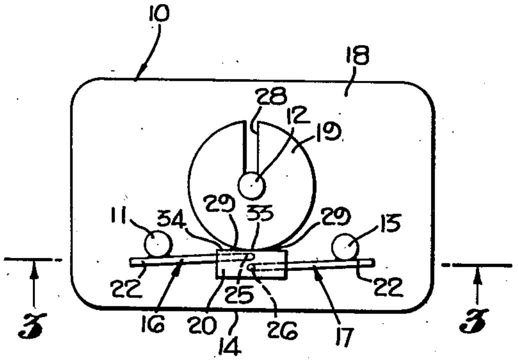
Figure 2 is a top plan view of the showing of Figure 1.

The semiconductor 20 is illustrated as rectangular in shape and is mounted tangentially of the forward surface of cylinder 19, for example by solder indicated at 29 in Figure 2. The lower surface 31 (Figure 3) of semiconductor 20 is disposed perpendicular to post 12 and is preferably at the same elevation as the lower end surface of cylinder 19. The diameter of cylinder 19, as well as the locations of electrode points 25 and 26, are selected so that collector point 25 will be a predetermined distance, governed by considerations set forth in the copending application cited above, from the ohmic contact formed at the junction 33 between the outer surface of cylinder 19 and the rear face 34 of semiconductor block 20. It will be observed that when the components are thus arranged, the collector and emitter points 25 and 26 will lie along a perpendicular to the junction 33, with the collector point 25 being positioned relatively close to the junction and the emitter point 26 being positioned relatively remote from it. In the present instance, the collector and emitter points 25 and 26 lie not only along a perpendicular to junction 33 but along an extended radius of cylinder 19 on the opposite side thereof from slot 28.

It is to be understood that the block 20 is made of germanium or other suitable semiconductor, and that the region of the point-contact between the collector 16 and semiconductor 20 is electrically formed in accordance with standard procedure. The present construction is highly advantageous in this connection since, should the forming or other factors be such that semiconductor 20 is unsuitable for transistor purposes, the device may be readily disassembled and the semiconductor 20 replaced by a new one. This is because it is merely necessary to slide base 19 upwardly off its post 12 in order to mount a new semiconductor 20, the operation taking place without disturbing the pre-setting of electrodes 16 and 17 which remain in position on support block 10 at all times. The semiconductor may also, if unsuitable as electrically formed for transistor purposes, be rotated to bring a new junction into contact with the emitter and collector to allow reforming, or the device may be readily disassembled as described.

It is a feature of the invention that the adjustment of base 19 and thus semiconductor 20, relative to collector and emitter electrodes 16 and 17, may be effected under direct microscopic observation, so that the proper positioning of the point-contacts relative to each other and to junction 33 is assured. In addition, the pressure exerted by semiconductor 20 on points 25 and 26 may be accurately adjusted merely by shifting base 19 along post 12. Once the proper pressure adjustment is effected, the base 19 remains in position until it is permanently locked as by the use of a thermo-setting plastic, or by crimping, soldering, welding, or other suitable process. As the final step in the assembly procedure, after all of the adjustments have been made, a cover or housing 36 (Figure 3) formed of metal or other suitable material may be fitted and hermetically sealed over support block 10 for the purpose of protecting the assembled device from mechanical damage and from the harmful effects of air and the chemicals contained in it.

In the operation of the device, after it is constructed and accurately assembled in the manner described above, the base 19 is normally at ground potential, while the collector is biased negatively and the emitter positively. A representative bias would be minus 20 volts for the collector 16, and a plus .5 volt for the emitter 17. Because of the locations of the point-contacts relative to each other and to junction 33, the resulting voltage gradients are additive to provide an efficient transfer of injected holes from the emitter point-contact to the collector point-contact. In addition, the location of the collector point-contact closely adjacent junction 33 results in the rapid dissipation of collector heat through base 19 to greatly reduce the adverse effects of heating on the operation of the device.

While the particular apparatus herein shown and described in detail is fully capable of attaining the objects and providing the advantages hereinbefore stated, it is to be understood that it is merely illustrative of the presently preferred embodiments of the invention and that no limitations are intended to the details of construction or design herein shown other than as defined in the appended claims.

I claim:

1. In a three-element semiconductor device, an emitter electrode, a collector electrode, a support block adapted to support said emitter and collector electrodes, slide means mounted on said support block and extending outwardly therefrom on the same side thereof as said emitter and collector electrodes, a base electrode slidably mounted on said slide means for movement relative to said emitter and collector electrodes, and a semiconductor mounted on said base electrode for movement therewith, said elements being constructed and arranged to provide predetermined point-contacts between said semiconductor and said emitter and collector electrodes upon sliding of said base electrode on said slide means to an operative position.

2. The invention as claimed in claim 1, wherein said emitter and collector electrodes are mounted relatively adjacent said support block, said slide means extend to a point relatively remote from said support block, and said semiconductor is mounted on the side of said emitter and collector electrodes remote from said support block.

3. The invention as claimed in claim 1, wherein said slide means is a post mounted in said support block, and said base electrode is a metallic mass encompassing said post and adapted to effect a resilient slidable grip therewith.

4. The invention as claimed in claim 3, wherein said resilient grip is effected by providing said mass with a gap, said gap extending from said post to the outer surface of said mass.

5. The invention as claimed in claim 3, wherein said post is an electrically conductive cylinder, and said metallic mass is a split cylinder having an axial bore to receive said post, said axial bore being of slightly lesser diameter than said post.

6. In a three-element semiconductor device, a support, emitter and collector electrodes mounted on said support, slide means mounted on said support and extending a substantial distance therefrom a base electrode mounted on said slide means for sliding movement relative thereto, said base electrode having a peripheral surface, and a semiconductor mounted on said base electrode for movement therewith, said semiconductor being formed with two intersecting faces one of which is in ohmic contact with said base electrode and the other of which is adapted to come into point-contact with said emitter and collector electrodes upon sliding of said base electrode.

7. The invention as claimed in claim 6, in which the point-contact of one of said emitter and collector electrodes with said semiconductor is relatively adjacent the junction of said one semiconductor face and said base electrode, and the point-contact of the other of said emitter and collector electrodes with said semiconductor is relatively remote from said junction.

8. The invention as claimed in claim 7, in which said one electrode is the collector.

9. The invention as claimed in claim 7, in which said point-contacts are disposed along a line generally normal to said junction.

10. The invention as claimed in claim 6, in which said two intersecting faces are generally perpendicular to each other, and said one of said intersecting faces is in ohmic contact with the peripheral surface of said base electrode to effect the mounting of said semiconductor in overhanging relationship relative to said support.

11. A transistor, comprising an insulating support block having upper and lower surfaces, emitter and collector electrode wires mounted on said support block above said upper surface, said electrode wires having upwardly projecting end portions terminating in points disposed in predetermined relationship relative to each other, an electrically conductive cylindrical slide post anchored in said support block and extending for a substantial distance above said electrode points, a cylindrical base element provided with an axial bore to receive said slide post and adapted for relative sliding movement therealong toward and away from said support block, said axial bore being of slightly lesser diameter than said slide post and communicating with a radial slot which extends to the outer cylindrical surface of said base element, and a semiconductor block mounted on said outer base element surface and having a generally horizontal lower surface disposed above said emitter and collector electrode points for point-contact therewith upon downward shifting of said base element.

12. The invention as claimed in claim 11, wherein said semiconductor block is jointed to said base element by an ohmic connection, the emitter and collector point-contacts with said semiconductor block are disposed along an extended radius of said base element outwardly adjacent said ohmic connection, and said collector point-contact is between said ohmic connection and said emitter point-contact.

References Cited in the file of this patent

UNITED STATES PATENTS

| | | |
|---|---|---|
| 2,538,593 | Rose | Jan. 16, 1951 |
| 2,618,691 | Bethge et al. | Nov. 18, 1952 |
| 2,634,323 | Pantchechnikoff | Apr. 7, 1953 |
| 2,640,901 | Kinman | June 2, 1953 |